United States Patent [19]

Hieber

[11] Patent Number: 4,767,496
[45] Date of Patent: Aug. 30, 1988

[54] METHOD FOR CONTROLLING AND SUPERVISING ETCHING PROCESSES

[75] Inventor: Konrad Hieber, Bernau, Fed. Rep. of Germany

[73] Assignee: Siemens Aktiengesellschaft, Berlin and Munich, Fed. Rep. of Germany

[21] Appl. No.: 113,829

[22] Filed: Oct. 29, 1987

[30] Foreign Application Priority Data

Dec. 11, 1986 [DE] Fed. Rep. of Germany ........ 3643379

[51] Int. Cl.$^4$ .............................. B44C 1/22; C23F 1/02
[52] U.S. Cl. ..................................... 156/627; 156/643;
156/646; 156/656; 156/659.1; 156/345;
204/192.33; 204/298
[58] Field of Search ............ 156/626, 627, 656, 659.1,
156/643, 646, 345; 204/192.32, 192.33, 192.35,
298; 324/71.2, 71.3, 71.5; 437/8; 427/9, 10

[56] References Cited

U.S. PATENT DOCUMENTS

| | | | |
|---|---|---|---|
| 4,207,137 | 6/1980 | Tretola | 156/627 |
| 4,358,338 | 11/1982 | Downey et al. | 156/627 |
| 4,543,576 | 9/1985 | Hieber et al. | 340/870.17 |
| 4,592,921 | 6/1986 | Hieber et al. | 427/9 |
| 4,602,981 | 7/1986 | Chen et al. | 156/627 |
| 4,622,094 | 11/1986 | Otsubo | 156/627 |

OTHER PUBLICATIONS

S. M. Sze, VLSI Technology, 301–307.
M. Clements, "Plasma Diagnostics with Electric Probes", Journal of Vacuum Science Technology, 15(2) Mar./Apr. 1978, pp. 193–198.

Primary Examiner—Willam A. Powell
Attorney, Agent, or Firm—Hill, Van Santen, Steadman & Simpson

[57] ABSTRACT

A method for controlling and supervising etching processes effected by ions, radicals, and/or neutral particles activated in a plasma includes identifying the etching rate and the final point of material erosion by the use of a reference substrate having a defined specimen geometry and situated on a moveable substrate holder in a recipient compartment or etching chamber. The electrical resistance of the specimen, which is dependent on the layer thickness of an electrically conductive layer, is measured and the measured data is transmitted in non-contacting fashion by electromagnetic radiation using pulse code modulation methods. A telemetric metrology system is used which is mounted on the moveable substrate holder as an independent unit. A process control computer supervises and, if need be, controls the etching parameters in the plasma.

7 Claims, 1 Drawing Sheet

METHOD FOR CONTROLLING AND SUPERVISING ETCHING PROCESSES

BACKGROUND OF THE INVENTION

1. Field of the Invention

The present invention is related generally to a method for controlling and supervising etching processes effected by ions, radicals and/or neutral particles activated in a plasma by identifying an etching rate and an end point of a layer to be etched that is situated on a substrate during material erosion. The etching processes are particularly used in structuring or configuring electrically conductive thin films to which has been applied a photoresist mask. An evacuated recipient in the form of an evacuatable airlock chamber is used as an etching reactor, and a moveable holder for carrying the substrate is provided.

2. Description of the Related Art

The designational and dimensionally true structuring of thin films by etching processes effected by plasma-activated ions, radicals and/or neutral particles (referred to as dry etching) is a critical process step in the manufacture of VLSI semiconductor components. For instance see the book, VLSI-technology by S. M. Sze, McGraw-Hill, Int. Book Comp. (1984), and in particular the chapter "Dry Etching", particularly pages 305, 306 and 307.

In what is known as dry etching processes, a structured layer of photoresist is first situated on a layer to be shaped or on a substrate to be shaped. The problem, then, is that the structure of the photoresist is to be transferred dimensionally true onto the layer or substrate lying therebeneath. For example, the substrate can be of single-crystal silicon. To this end, the layer or substrate which has been locally coated with a photoresist is bombarded with suitable ions or is introduced into a plasma. The particles consisting of ions and neutrals that are chemically activated in the plasma react with the exposed layer or substrate material upon formation of a volatile compound so that local material erosion insues. The local material erosion may be promoted by a simple impact process using atoms, ions, or molecules (known as atomizing or sputtering).

Care must be exercised in developing etching processes to ensure that the reactivity of the plasma is such that the erosion rate for the photoresist and/or for the material under the layer to be shaped is optimally low, which can be accomplished by a suitable selection of initial gases. This requires that a separate etching process be developed for every layer material and also that material of the preceding and superceding layers be taken into consideration. Furthermore, since an extremely high reproducability is required for very slight dimensional tolerances of, for example, ±0.1 μm the process must be constantly supervised.

SUMMARY OF THE INVENTION

It is an object of the present invention to provide a supervision and control method for dry etching with which is possible to identify the etching rate and the end point of a layer for accurately reproducing structures in a layer or substrate to meet the above described conditions.

Up to now, spectrometric methods were generally used to characterize the plasma so that identification of the etching rate and the end point of the etching can be accomplished (see S. M. Sze, VLSI-technology, McGraw-Hill, Int. Book Company (1984), page 334). It is thereby essential to spectrometrically find the emission or absorption line of a molecule in the plasm which is characteristic of the respective etching process. The intensity of the line diminishes quickly when the material to be etched is completely eliminated. For a known layer thickness, the etching rate can be calculated from the time which elapses from the start of the process to the decrease in intensity of the characteristic line. It is obvious that with this method the results are an average over the etching behavior of all wafers in a system. This approach also assumes that the etching rate is constant over a layer. For local identification of the etching rate, the specimens must be removed to identify the extent of material erosion, for example, by the use of a scanning electron microscope. Local characterization or identification of the plasma is extremely difficult since the plasma itself is too greatly influenced by the necessary probes, for example, Langmuir probes, extending into the plasma. For further details, see the article by Clements in Journal of Vacuum Science Technology, 15 (2), March/April 1978, pages 193-198, incorporated herein by reference.

The present invention pursues a different approach for resolving the object of reproducible supervision of dry etching processes and also solves the problem of directly operating on the process in a controllable fashion. The invention is characterized by a method of the type initially cited in which the etching rate and the final point of the material erosion are identified with the assistance of a reference substrate having a defined layer specimen geometry connected to low impedance contacts. By measuring the electrical resistance of the layer on the reference substrate, the resistance of which is dependent upon the layer thickness, and transmitting the measured data in non-contacting fashion using, for example, electromagnetic radiation, the etching rate and the final etching point are identified. In one development, pulse code modulation (PCM) is used in a telemetric metrology system so that the apparatus for carrying out the present method can be mounted as an independent unit on a moveable substrate holder.

It is within the framework of the present invention to measure the surface resistance of a layer and to, thus, measure the decrease in layer thickness and identify the final point of the etching by a chronological curve of the increase in resistance of the layer on a reference substrate. A resistance measurement is performed in situ as disclosed in European patent No. 0 067 432. However, it is disclosed in such patent for use in building up layers by vapor deposition or sputtering.

European patent application 0 154 696 discloses a method for supervising and controlling the composition and the layer thickness of metallically conductive alloy layers, wherein the electrical resistance is measured during the production of the layer. By comparing the measured, actual values of the layer resistance for every individual layer of alloy component to the rated values determined for the layer manufacture, the coating rates of the corresponding alloy components are controlled.

The present invention uses this concept to control and/or supervise the erosion of an electrically conductive layer. In other words, the etching rate, or the time dependency thereof, is supervised including the final etching point. It is of significance that control of the etching rate is influenced by (a) the overall pressure of the etching system, (b) the RF power in the plasma generator,
(c) the ion energy,
(d) the gas composition,
(e) the presence of residual gases in the system, and
(f) the size of the regions to be configured.

The dependency of the etching rate on the size of the regions to be configured can be supervised when, in accordance with an exemplary embodiment of the invention, photoresist masking regions of different sizes are generated on the reference substrate and are subsequently dry-etched and simultaneously electrically measured. The regions of the reference substrate are preferably of substantially the same dimensions as that of the actual substrates whose etching is being controlled.

DESCRIPTION OF THE PREFERRED EMBODIMENTS

During dry etching using ions, radicals, or neutral particles activated in a plasma, a specimen substrate on which a layer of defined geometry is provided for use as a reference. Electrical contacts are applied to the specimen layer for measuring the electrical resistance of the layer. The specimen layer is etched along with other substrates on which layers to be etched are present. As etching proceeds, the layer thickness decreases and the electrical resistance of the layer increases correspondingly. The measured resistance values are transmitted from the reference specimen, for example, by pulse code modulated electromagnetic radiation so that the reference specimen can be moved independently in an etching chamber. From the measured resistance values, it is possible to supervise and control the etching process of the other substrates. Of course, the etching characteristics of the reference layer should be at least similar to the etching characteristics of the other substrates.

Figure 1:
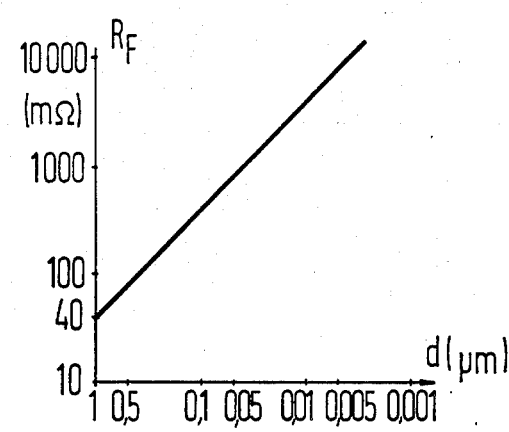
FIG. 1 is a graph showing the dependency of surface resistance on layer thickness of a metallic layer to be etched.

With the above-described apparatus, the change in surface resistance per layer thickness can be identified. For example, FIG. 1 is a graph showing the increase of surface resistance $R_F$ of an aluminum-silicon alloy layer as it is etched dependent on the remaining layer thickness d. The resistance $R_F$ is in mOhms and the layer thickness d is shown in micrometers. Note that both the ordinate and the abscissa of the graph are in logarithmic progression. The surface resistance $R_F$ is calculated from the quotient of specific electrical impedance relative to layer thickness. For a specific electrical impedance of, for example, 4 micro-Ohmcm for aluminum/-silicon alloy of 1% silicon, a straight line graph derives in double logarithmic representation, as shown in FIG. 1.

The layer resistance measurements of the reference layer are performed in the following way: Referring to FIGS. 2 thru 5, the reference layer to be configured is applied to a reference substrate wafer in a fashion entirely analogous to that of a semiconductor crystal wafer provided for manufacturing an integrated circuit. The entire reference substrate wafer, or a subregion thereof, is integrated into a telemetry system shown in FIG. 6 and electrical contacts are applied. A metrological system is operated through the telemetry system to indicate a specific surface resistance $R_F$ for the reference layer. For a specific aluminum-silicon (1%) layer of, for example, 1 μm thickness, the specific surface resistance $R_F = 40$ mOhms. The reference substrate is placed in an etching chamber with the other substrates whose etching is being supervised and controlled. The etching process is begun so that the reference substrate is etched along with the other substrates. As the reference layer becomes thinner and thinner during the etching process, the surface resistance $R_F$ greatly increases so that the remaining layer thickness of the reference substrate, and the other substrates, can be determined.

As may be seen from the course of the curve shown in FIG. 1, the greatest change in resistance is achieved precisely in the region of interest, in other words shortly before the removal of the reference layer is complete. Since the telemetry system in the etching system permits the substrate holder to be moved in exactly the same fashion as the semiconductor crystal wafers or other substrates being processed, information about chronological and topical fluctuations in the etching process are obtained from the chronological curve of the increase in resistance.

Figure 2:
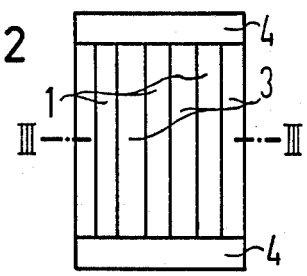
FIG. 2 is a plan view of a reference substrate having a finely structured photoresist layer including measuring contacts provided for measurement.
Figure 4:
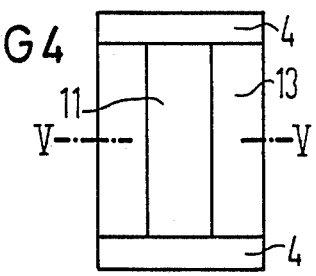
FIG. 4 is a plan view of a reference substrate having a coarsely structured photoresist layer with measuring contacts provided for measurement.
Figure 3:
FIG. 3 is a cross section along line III—III of the substrate of FIG. 2.
Figure 5:
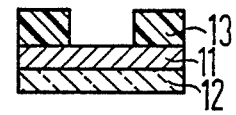
FIG. 5 is a cross section along line V—V of the substrate of FIG. 4.

Referring specifically to FIGS. 2 through 5, the reference substrate used for measurement includes an aluminum-silicon (1%) alloy layer 1 or 11 to be eroded, an electrically insulated substrate 2 or 12, a finely structured photoresist layer 3 shown in FIGS. 2 and 3, low impedance contact electrodes 4 for obtaining a measurement, and coarsely structured photoresist layers 13 shown in FIGS. 4 and 5.

The disclosed method is useful in monitoring the manufacturing of structures formed by metallically conductive layers that are in the sub-micrometer range.

To identify a potential dependency of the etching rate on the size of the region to be configured or structured, photoresist structures of different sizes are produced on the reference substrate and are then etched and electrically measured. When the sum of the widths of the narrow aluminum layers 1 in FIGS. 2 and 3 is equal to the width of a broad aluminum layer 11 in FIGS. 4 and 5, then a direct conclusion regarding the difference in the etching rate can be drawn for different curves of the resistance increase while etching.

Figure 6:
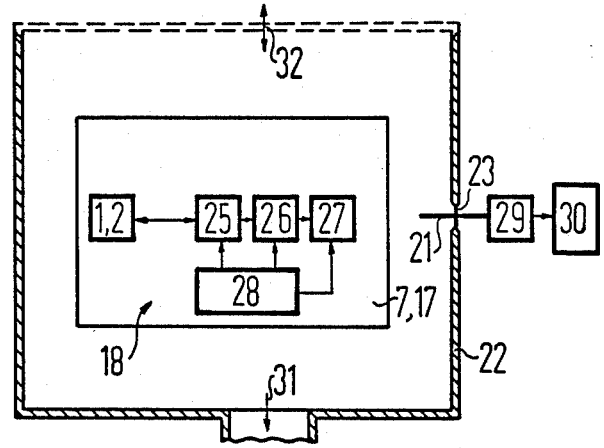
FIG. 6 is a functional block diagram of the inter relationship of a metrological system and its arrangement relative to an etching system.

In FIG. 6 is shown an arrangement similar to that disclosed in European patent No. 0 067 432, incorporated herein by reference. A metrology system 18 including a transmitter 27 is integrated into a double palette 7 and 17 which represents an independent system. The double palette 7 and 17 rotates so that measured data transmission ensues through a telemetry system, whereby a converter which converts the measured voltage of the layer 1 and 2 into transmittable pulse-code-modulation signals is disposed under the palette 7 and 17. The measuring apparatus 18 includes the transmitter 27 operated by a battery 28. When radio frequency technology is used for the measured data transmission, a reception antenna 21 is provided inside a recipient enclosure or etching chamber 22 and extends out of the recipient enclosure 22 through an insulated vacuum feed through 23. A receiver 29 is disposed outside of the system 22 to edit the received telemetric data. The measured data can either be presented for evaluation as digital or as analog signals. When the meaured data is present in digital form, the data is directly accepted by a computer 30, such as a process control computer, which undertakes immediate evaluation of the data and calculates corrrections for individual etching parameters and modifies the etching parameters accordingly. Once the etching rate and end point can be accurately supervised, it becomes possible to control the etching process such as by, for example, varying the RF power to the plasma generator and/or changing the gas composition.

Other elements of the block diagram shown in FIG. 6 include a resistance measurement unit 25, a converter, such as a PCM modulator 26, a vacuum connection 31 for the recipient chamber 22, and lastly, an attached lock chamber 32 indicated by a double arrow.

Although other modifications and changes may be suggested by those skilled in the art, it is the intention of the inventor to embody within the patent warranted hereon all changes and modifications as reasonably and properly come within the scope of his contribution to the art.

I claim:

1. A method for controlling and supervising an etching process, comprising:
    identifying an etching rate and a final point of material erosion with a reference substrate having a defined specimen geometry with low-impedance contacts, including measuring electrical resistance of the reference substrate dependent on layer thickness;
    transmitting measured data in a non-contacting fashion by pulse-code-modulation of electromagnetic radiation; and
    using a telemetric metrology system which is mounted at a moveable substrate holder as an independent unit.

2. A method as claimed in claim 1, further comprising:
    measuring a surface resistance of the reference substrate;
    supervising a decrease in layer thickness of the reference substrate by changes in the surface resistance; and
    identifying a final point of etching by a chronological curve of an increase in the surface resistance.

3. A method as claimed in claim 1, further comprising:
    identifying potential variations in etching rate dependent on the size of regions to be structured in a metallically conductive layer by using photoresist masked regions of different sizes on said reference substrate.

4. A method as claimed in claim 1, further comprising:
    determining measured values of the electrical resistance of the reference substrate by a process control computer.

5. A method for controlling and supervising dry etching, comprising:
    providing a reference substrate with an electrically conductive layer for etching;
    providing low impedance contacts on the electrically conductive layer;
    etching the electrically conductive layer on the reference substrate;
    measuring changes in resistance of the electrically conductive layer during etching;
    determining an etching rate and an end point of the electrically conductive layer by monitoring the measured changes in resistance.

6. A method as claimed in claim 5, wherein the electrically conductive layer to be etched is of dimensions corresponding to other substrates to be etched.

7. A method as claimed in claim 5, further comprising:
    mounting the reference substrate to be etched on a holder with other substrates to be etched; and
    independantly moving the holder during etching.

* * * * *